United States Patent
Luo et al.

(10) Patent No.: US 9,117,752 B2
(45) Date of Patent: Aug. 25, 2015

(54) KINK POLY STRUCTURE FOR IMPROVING RANDOM SINGLE BIT FAILURE

(75) Inventors: Shing Ann Luo, Miaoli County (TW); Yung-Tai Hung, Chiayi (TW); Chin-Ta Su, Yunlin County (TW); Tahone Yagn, Miaoli County (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 620 days.

(21) Appl. No.: 13/288,275

(22) Filed: Nov. 3, 2011

(65) Prior Publication Data

US 2013/0113031 A1 May 9, 2013

(51) Int. Cl.

| | |
|---|---|
| *H01L 27/115* | (2006.01) |
| *H01L 27/108* | (2006.01) |
| *H01L 29/788* | (2006.01) |
| *H01L 21/28* | (2006.01) |
| *H01L 29/78* | (2006.01) |
| *H01L 29/423* | (2006.01) |

(52) U.S. Cl.
CPC .... *H01L 21/28114* (2013.01); *H01L 21/28273* (2013.01); *H01L 27/10802* (2013.01); *H01L 27/1156* (2013.01); *H01L 27/11521* (2013.01); *H01L 27/11558* (2013.01); *H01L 29/42324* (2013.01); *H01L 29/42328* (2013.01); *H01L 29/7841* (2013.01)

(58) Field of Classification Search
CPC ............ H01L 27/115; H01L 27/11521; H01L 27/11558; H01L 27/1156; H01L 27/1157; H01L 27/10802; H01L 29/788; H01L 29/7841; H01L 29/42324; H01L 29/42328; H01L 29/66825
USPC .................................. 257/315, 316, E29.129
See application file for complete search history.

(56) References Cited

U.S. PATENT DOCUMENTS

2006/0160305 A1* 7/2006 Mokhlesi et al. ............. 438/257

* cited by examiner

*Primary Examiner* — Thanhha Pham
(74) *Attorney, Agent, or Firm* — Baker & McKenzie LLP (57) ABSTRACT

A memory cell having a kinked polysilicon layer structure, or a polysilicon layer structure with a top portion being narrower than a bottom portion, may greatly reduce random single bit (RSB) failures and may improve high density plasma (HDP) oxide layer fill-in by reducing defects caused by various impurities and/or a polysilicon layer short path. A kinked polysilicon layer structure may also be applied to floating gate memory cells either at the floating gate structure or the control gate structure.

6 Claims, 14 Drawing Sheets

KINK POLY STRUCTURE FOR IMPROVING RANDOM SINGLE BIT FAILURE

BACKGROUND

1. Technical Field

The present application relates generally to semiconductor devices and includes methods and structures for improving random single bit (RSB) failure.

2. Related Art

Figure 1:
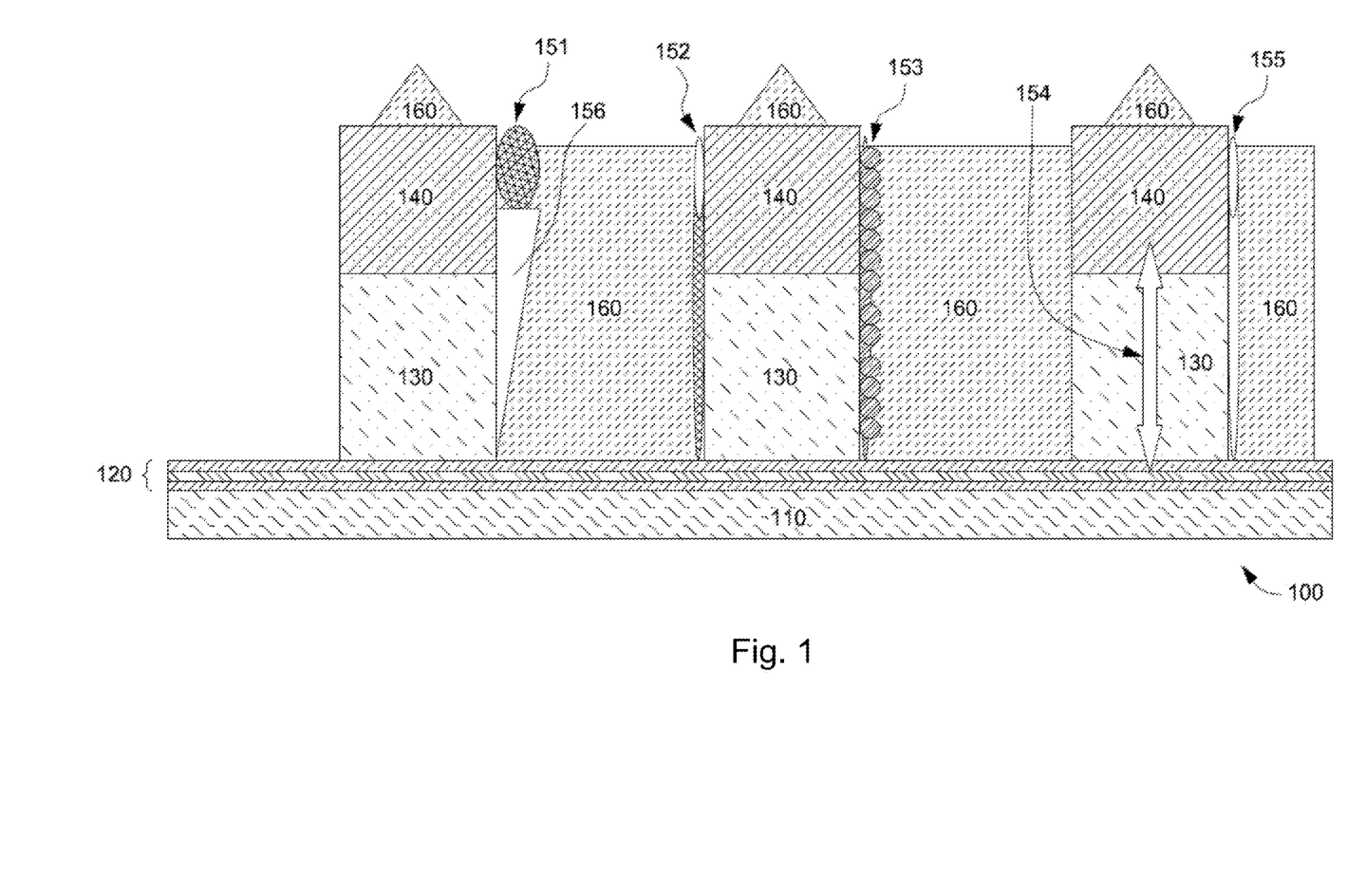
FIG. 1 is a schematic diagram illustrating common RSB failure mechanisms.

FIG. 1 is a schematic diagram illustrating a cross-sectional view of a memory device 100. The memory device 100 includes substrate 110, oxide-nitride-oxide layer 120, polysilicon layer 130, and hard mask layer 140. For example, the hard mask layer 140 comprises a silicon nitride ($Si_3N_4$) layer. The memory device 100 also includes high density plasma (HDP) oxide portions 160. In conventional methods of constructing a memory device 100 may result in various impurities or particles that may lead to RSB failure.

For example, in some conventional memory devices, a particle defect 151 may occur. The particle defect may be a silicon nitride ($Si_3N_4$) particle, an impurity particle, or an HDP particle. The particle defect 151 may cause a void or gap 156 at the interface between the HDP oxide portion 160 and polysilicon layer 130, which may result in a path for a later conductive layer to come into contact with the substrate 110. As another example, a polymer residual 152 may result from etching from conventional memory device manufacturing techniques. For example, if an etchant recipe is not optimum, some bi-product residue may form on a sidewall of a stack of polysilicon layer 130 and hard mask layer 140, which may also potentially result in a path between a conductive layer and the substrate 110. Weak oxide residues 153 may also exist. For example, if the HDP oxide is not optimum, an interface between the HDP oxide layer 160 and the stacks may be weak, which may also result in a path between a conductive layer and the substrate 110. As another example, phosphoric acid 154 may flow down a crack in the polysilicon layer 130, which can cause chemical damage on the substrate 110 resulting in an increased number of RSB failures. Further, the polysilicon layer 130 may have a rough side wall 155 which may result in cracks between the polysilicon layer 130 and the HDP oxide portions 160, which may also result in an increased number of RSB failures. Any of these failures, if present during the deposition of a conductive layer, may cause the conductive layer to leak down to the substrate, causing a short or a RSB failure.

Figure 2:
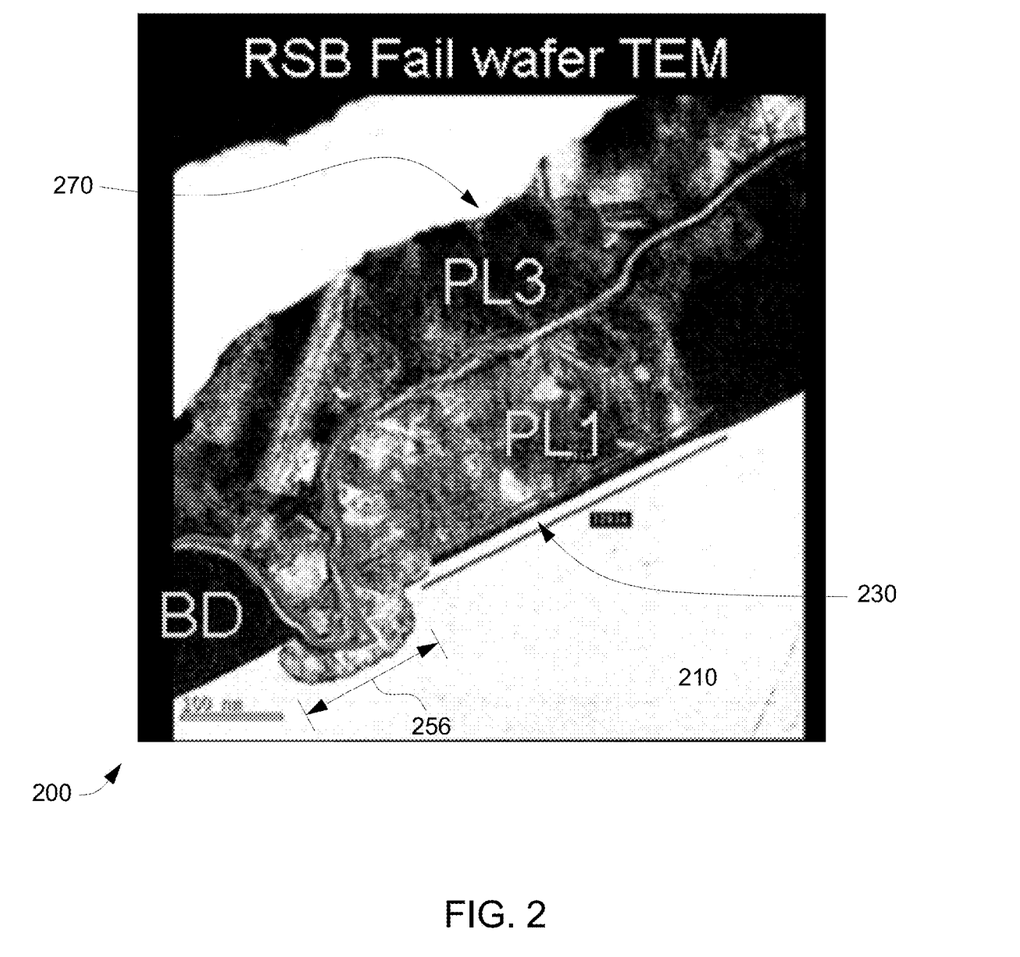
FIG. 2 is a schematic diagram illustrating a transmission electron microscopy view of RSB failures.

FIG. 2 is a schematic diagram illustrating transmission electronic microscopy (TEM) view of RSB failures on a wafer 200 for a floating flash gate. As shown in portion 256, a top conductive polysilicon layer PL3 270 has leaked down and is in connection with the substrate 210, which may cause an RSB failure.

Thus, it is desirable to find new approaches for improving memory cell processes, particularly so as to decrease the number of RSB failures in memory devices.

SUMMARY

Disclosed herein are methods and systems for forming memory cells including floating gate memory cells.

According to an aspect, one or more stacks are formed on a substrate. Each stack includes an oxide-nitride-oxide (ONO) layer and a polysilicon layer formed on a top surface of the ONO layer. An oxide layer is formed between the stacks. The polysilicon layer of each of the stacks has side surfaces adjacent to the oxide layer between the stacks, and a top portion of the side surfaces of the polysilicon layer is narrower than a bottom portion of the side surfaces of the polysilicon layer.

According to another aspect, a substrate having an oxide-nitride-oxide (ONO) layer formed thereon is provided. A polysilicon layer is formed on a top surface of the ONO layer, and a hard mask silicon nitride ($Si_3N_4$) layer is formed on a top surface of the polysilicon layer. A partial pattern is to the polysilicon layer and the hard mask silicon nitride ($Si_3N_4$) layer to form stacks. Each stack includes a portion of the polysilicon layer and a portion of the hard mask silicon nitride ($Si_3N_4$) layer, and apertures are defined in the silicon nitride ($Si_3N_4$) hard mask and polysilicon layers between the stacks. The polysilicon layer of each of the stacks has side surfaces adjacent to the apertures, and the hard mask silicon nitride ($Si_3N_4$) layer of each of the stacks has side surfaces adjacent to the apertures. A portion of the hard mask silicon nitride ($Si_3N_4$) and polysilicon layers is removed, such that a top portion of the side surfaces of the polysilicon layer of each of the stacks are substantially flush with the side surfaces of the hard mask silicon nitride ($Si_3N_4$) layer of each of the stacks, and such that the top portion of the side surfaces of the polysilicon layer is narrower than a bottom portion of the side surfaces of the polysilicon layer.

According to another aspect, a memory cell includes a substrate, one or more stacks formed on the substrate, and an oxide layer formed over and between the stacks. The stacks include an oxide-nitride-oxide (ONO) layer and a polysilicon layer formed on a top surface of the ONO layer. The polysilicon layer of each of the stacks has side surfaces adjacent to the oxide layer between the stacks, and a top portion of the side surfaces of the polysilicon layer is narrower than a bottom portion of the side surfaces of the polysilicon layer.

According to another aspect, a floating gate memory cell includes a substrate, an insulation layer formed over the substrate, and a polysilicon floating gate structure formed over the insulation layer. A top portion of the polysilicon floating gate structure is narrower than a bottom portion of the polysilicon floating gate structure.

According to another aspect, a floating gate memory cell includes a substrate, an insulation layer formed over the substrate, a polysilicon floating gate structure formed over the insulation layer, a second insulation layer formed over the polysilicon floating gate structure, and a control gate structure. A top portion of the control gate structure is narrower than a bottom portion of the control gate structure.

BRIEF DESCRIPTION OF THE DRAWINGS

Features, aspects, and embodiments of the inventions are described in conjunction with the attached drawings, in which.

DETAILED DESCRIPTION

Referring to FIGS. 3-9, cross-sectional view diagrams illustrate a memory cell and a method of forming a memory cell with a reduced number of RSB failures. The memory cell is made using partial polysilicon layer etching with hard mask pull-back (e.g., silicon nitride ($Si_3N_4$) pull-back). The memory cell and the processes used for forming the memory cell improve high density plasma oxide fill-in capability and improve random single bit (RSB) failures by interrupting the polysilicon layer short path using a kinked polysilicon profile created by the polysilicon layer etching and hard mask pull-back. A kinked polysilicon profile results in multiple advantages including, but not limited to, enhanced HDP oxide layer fill-in and greatly reducing or eliminating RSB failure issues discussed above.

Figure 3:
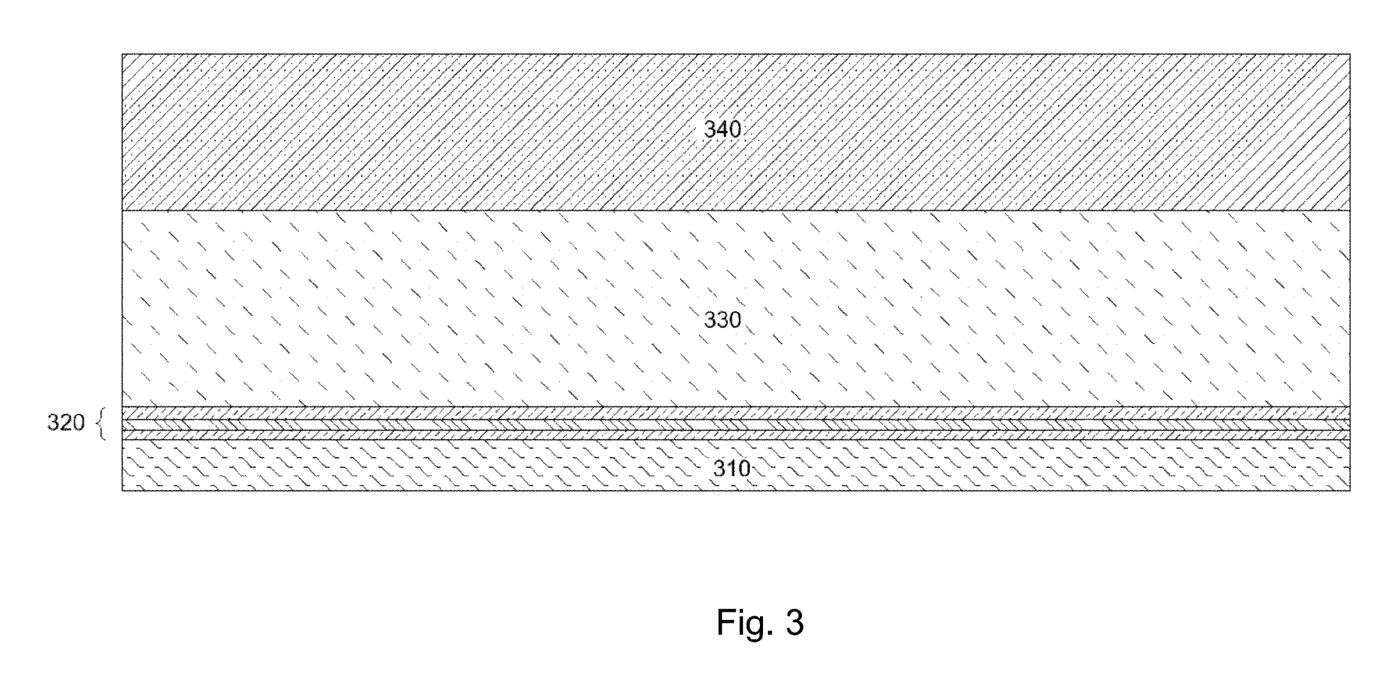
FIG. 3 is a schematic diagram illustrating a memory cell, in accordance with the present disclosure.

FIG. 3 is a schematic diagram illustrating a cross-sectional view of an N-bit memory cell 300. Memory cell 300 includes a substrate 310. An oxide-nitride-oxide (ONO) layer 320 is formed on the substrate 310, and a polysilicon layer 330 is formed on the ONO layer 320. A hard mask layer 340 is formed on the polysilicon layer 330. In an embodiment, the hard mask layer is a silicon nitride ($Si_3N_4$) layer.

Figure 4:
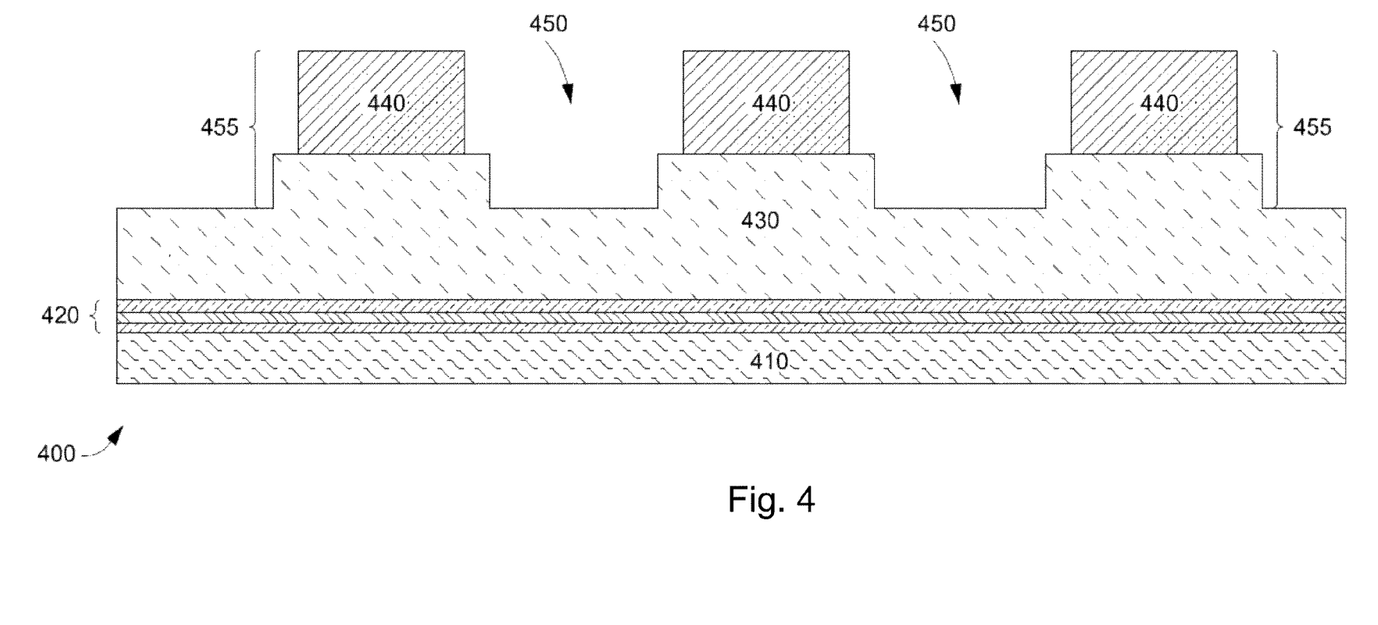
FIG. 4 is a schematic diagram illustrating a memory cell with a partial pattern applied, in accordance with the present disclosure.

FIG. 4 is a schematic diagram illustrating a cross-sectional view of a memory cell 400 with a partial pattern applied. Memory cell 400 includes a substrate 410, an oxide-nitride-oxide (ONO) layer 420 formed on the substrate 410, a polysilicon layer 430 formed on the ONO layer 420, and a hard mask layer 440 formed on the polysilicon layer 430. In an embodiment, the hard mask layer 440 may be a silicon nitride ($Si_3N_4$) layer. A partial pattern has been applied and a hard mask pull-back (e.g., silicon nitride ($Si_3N_4$) pull-back) process is used. For example, a phosphoric acid ($H_3PO_4$) is applied and approximately 100-150 Angstroms of hard mask is removed in a partial pattern, resulting in apertures 450 between stacks 455 of the polysilicon layer 430 and the hard mask layer 440.

Figure 5A:
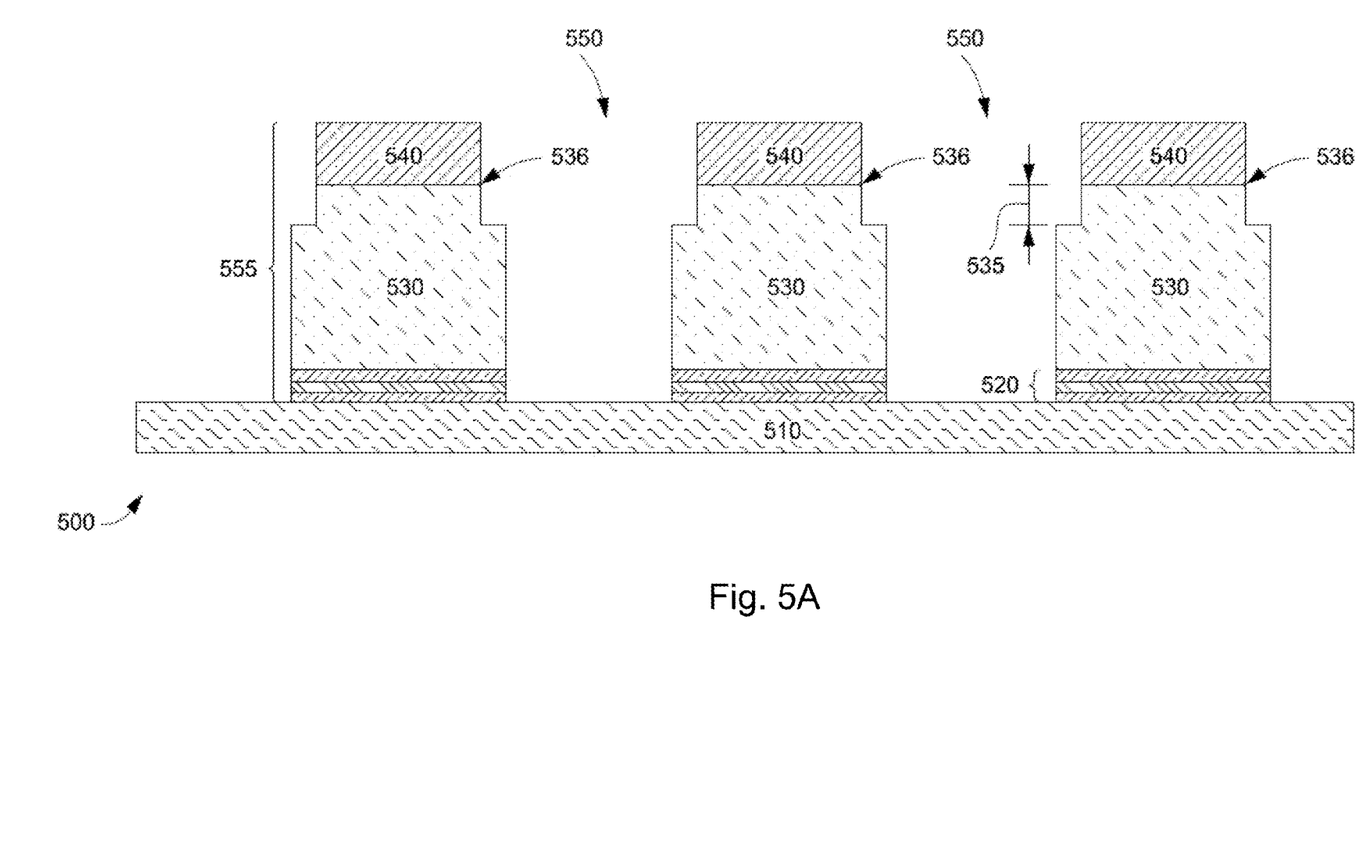
FIG. 5A is a schematic diagram illustrating a memory cell with etching, in accordance with the present disclosure.

FIG. 5 is a schematic diagram illustrating a cross sectional view of a memory cell 500 with dry etching used to further define a profile. Memory cell 500 includes a substrate 510, an oxide-nitride-oxide (ONO) layer 520 formed on the substrate 510, a polysilicon layer 530 formed on the ONO layer 520, and a hard mask layer 540 formed on the polysilicon layer 530. In an embodiment, the hard mask layer 540 may be a silicon nitride ($Si_3N_4$) layer. Apertures 550 are defined in the polysilicon layer 530 and the hard mask layer 540. Dry etching is applied to the memory device 500 to further define the profile of the stacks 555. The dry etching is used to remove more of the polysilicon layer 530. For example, a portion of the polysilicon layer 530 is also removed by dry etching. And a top portion of the polysilicon layer 530 is also removed such that the sides of the polysilicon layer 530 are substantially flush with the sides of the hard mask layer 540 for a distance 535 from the top portion 536 of the polysilicon layer.

Figure 5B:
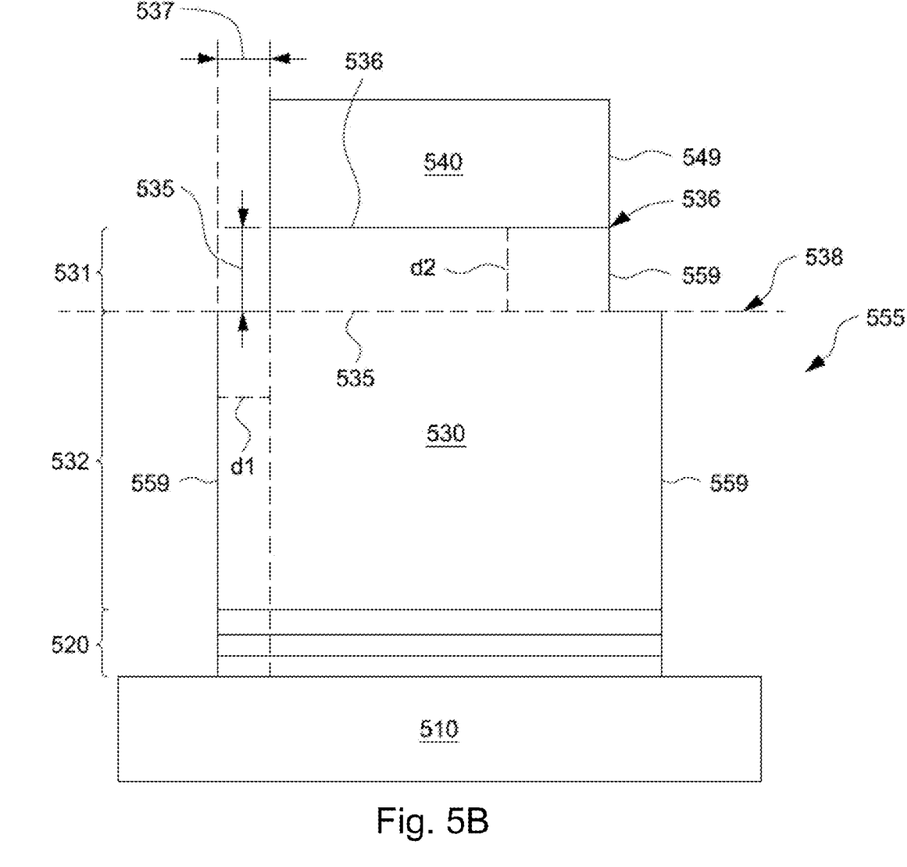
FIG. 5B is a schematic diagram illustrating an intermediate stack, in accordance with the present disclosure.

FIG. 5B is a schematic diagram illustrating a detailed view of an stack 555 of FIG. 5. Stack 555 includes ONO layer 520, polysilicon layer 530, and hard mask layer 540. The polysilicon layer 530 of each of the stacks 555 has side surfaces 559 adjacent to the apertures, and the hard mask layer of each of the stacks also has side surfaces adjacent to the apertures. A portions of the hard mask and polysilicon layers have been removed, such that a top portion 531 of the side surfaces 559 of the polysilicon layer 530 of each of the stacks 555 are substantially flush with the side surfaces 549 of the hard mask layer 540 of each of the stacks 555. Further, the top portion 531 of the side surfaces 559 of the polysilicon layer 530 is narrower than a bottom portion 532 of the side surfaces 559 of the polysilicon layer 530. In an embodiment, the top portion 531 is narrower on each side of the stack 555 by a first distance 537.

In an embodiment, a top portion 531 of the side surfaces 549 of the polysilicon layer 530 of each of the stacks 555 extends from the top surface 536 of the polysilicon layer 530 to an intermediate cross-section 539 of the polysilicon layer 530 of each of the stacks 555, the intermediate cross-section 539 is a line substantially parallel to the top surface 536 of the polysilicon layer 530. A second distance 535 is defined by a line extending from and substantially perpendicular to the top surface 536 of the polysilicon layer to the cross-section 539 of the polysilicon layer 530. In an embodiment, the second distance is in the range of 100-200 Å. In another embodiment, the second distance is in the range of 100-150 Å.

Figure 6:
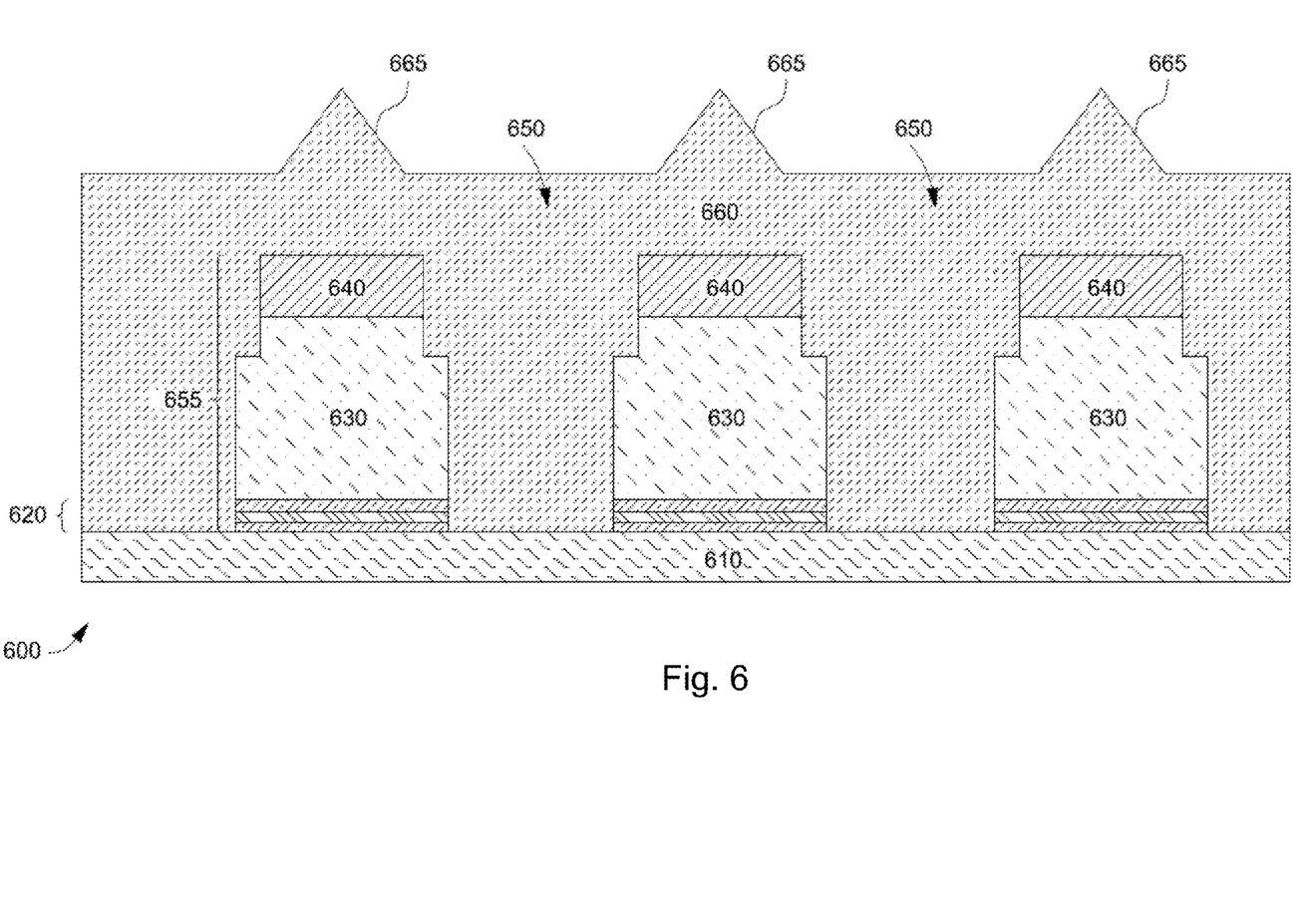
FIG. 6 is a schematic diagram illustrating a memory cell with a high density plasma (HDP) oxide fill-in, in accordance with the present disclosure.

FIG. 6 is a schematic diagram illustrating a cross sectional view of a memory cell 600 with oxide layer or dielectric layer fill in applied. Memory cell 600 includes a substrate 610, an oxide-nitride-oxide (ONO) layer 620 formed on the substrate 610, a polysilicon layer 630 formed on the ONO layer 620, and a hard mask layer 640 formed on the polysilicon layer 630. In an embodiment, the hard mask layer 640 may be a silicon nitride ($Si_3N_4$) layer. To form the memory device 600 an oxide layer 660 (or dielectric layer 660) is deposited over the stacks. In an embodiment, a high density plasma (HDP) oxide 660 is used to cover the stacks 655 and to fill the apertures 650. High density plasma (HDP)-filled apertures 650 are defined in the polysilicon layer 630 and the hard mask layer 640 between stacks 655. The peaks 665, which are oxide layer 660 stacked over the stacks 650, result in an uneven surface of the oxide layer 660.

Figure 7:
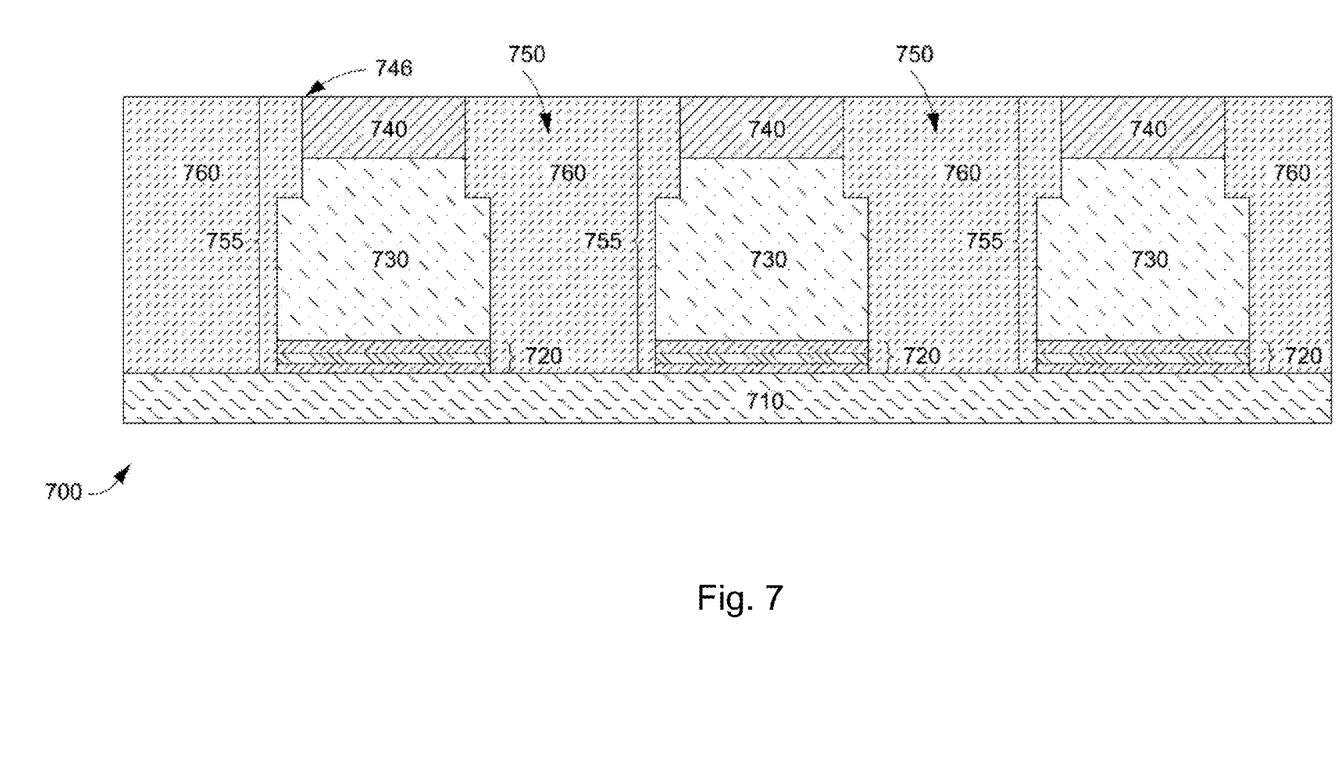
FIG. 7 is a schematic diagram illustrating a memory cell with chemical mechanical polishing applied, in accordance with the present disclosure.

FIG. 7 is a schematic diagram illustrating a cross sectional view of a memory cell 700 with chemical mechanical polishing (CMP) applied. Memory cell 700 includes a substrate 710, an oxide-nitride-oxide (ONO) layer 720 formed on the substrate 710, a polysilicon layer 730 formed on the ONO layer 720, and a hard mask layer 740 formed on the polysilicon layer 730. In an embodiment, the hard mask layer 740 may be a silicon nitride ($Si_3N_4$) layer. HDP 760 oxide-filled apertures 750 are defined in the polysilicon layer 730 and the hard mask layer 740 between stacks 755. A chemical mechanical polishing (CMP) process is used to remove the oxide layer 760 deposited over the stacks 755. In an embodiment, the CMP process is used until a top portion 766 of the oxide layer 760 is substantially flush with a top portion 746 of the hard mask 740.

Figure 8:
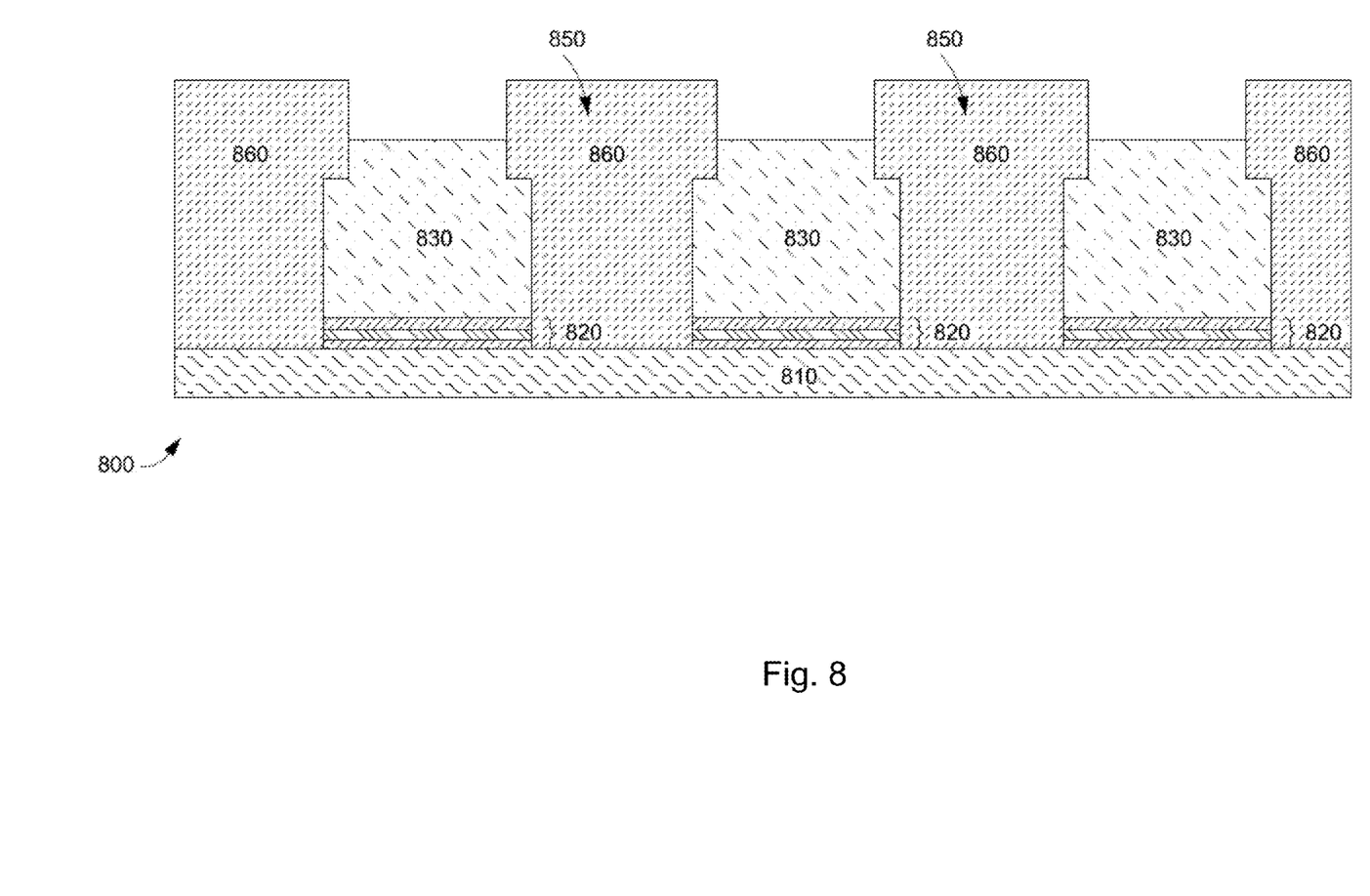
FIG. 8 is a schematic diagram illustrating a memory cell with the hard mask removed, in accordance with the present disclosure.

FIG. 8 is a schematic diagram illustrating a cross sectional view of a memory cell 800 with hard mask removal applied. Memory cell 800 includes a substrate 810, an oxide-nitride-oxide (ONO) layer 820 formed on the substrate 810, and a polysilicon layer 830 formed on the ONO layer 820. A hard mask layer 840 formed on the polysilicon layer 830 has been removed.

Figure 9:
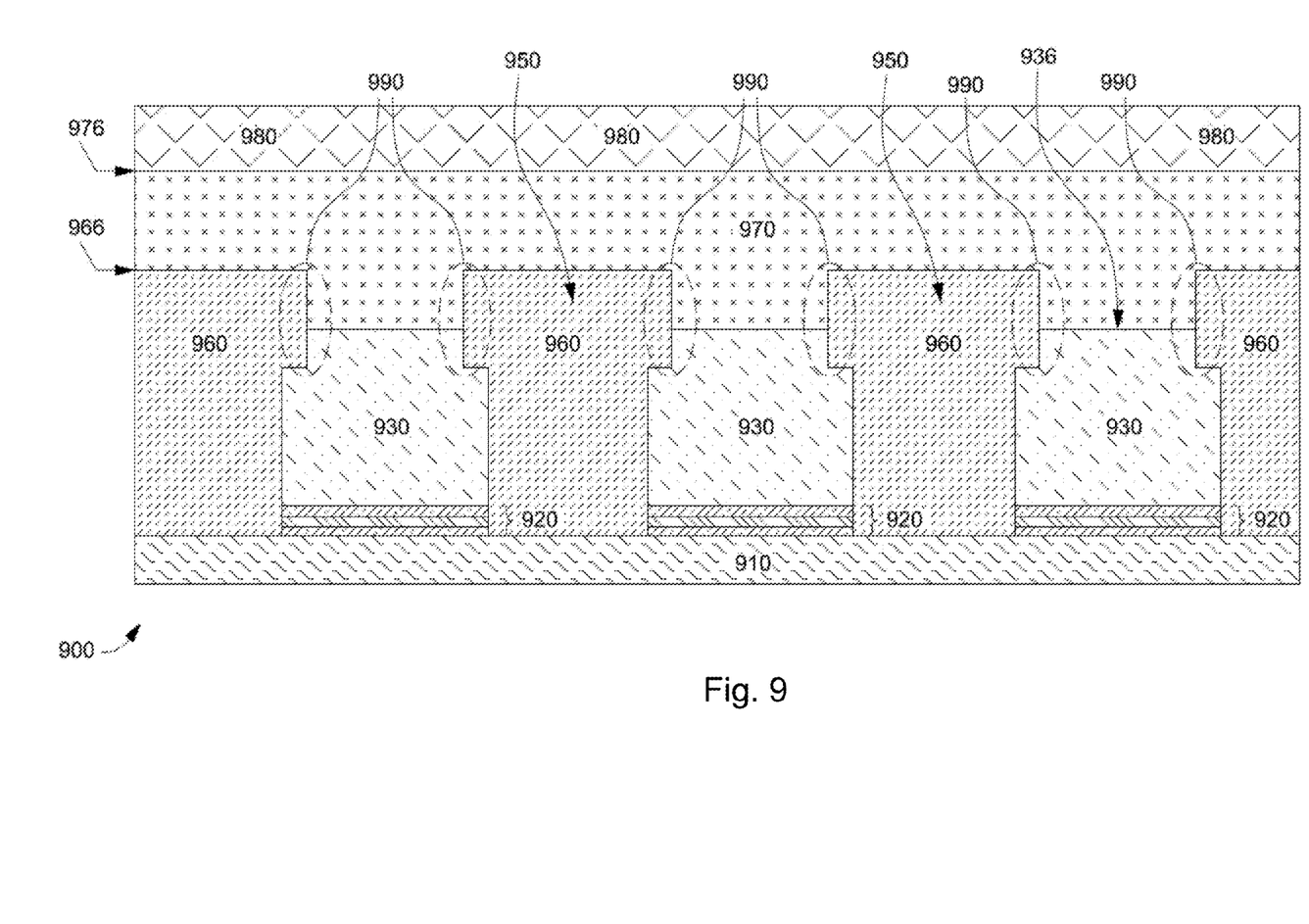
FIG. 9 is a schematic diagram illustrating a memory cell with a poly/WSi$_x$ process applied, in accordance with the present disclosure.

FIG. 9 is a schematic diagram illustrating a cross sectional view of a memory cell 900. Memory cell 900 includes a substrate 910, an oxide-nitride-oxide (ONO) layer 920 formed on the substrate 910, and a polysilicon layer 930 formed on the ONO layer 920. HDP oxide 960 filled apertures 950 are defined in the polysilicon layer 930 resulting in stacks of polysilicon layer 930 and ONO layer 920. Another polysilicon layer 970 is formed on a top portion 966 of the HDP oxide 960 and on a top portion 936 of the polysilicon layer 930. A silicide layer 980, such as tungsten polycide ($WSi_x$), titanium silicide, cobalt silicide, nickel, etc., is formed on a top portion 976 of the polysilicon layer 970. The memory cell 900 includes a indention 990 in the top portion 936 of the polysilicon layer 930, resulting in an interruption or prevention of a polysilicon layer 930 short path. For example, even if a random particle, such as those process defects discussed above, were to appear during the manufacturing process, the interface between the polysilicon layer 930 and HDP oxide layer 960 includes the indentation 990 to prevent potential voids from forming down to the substrate. Accordingly, when the HDP oxide layer 960 is applied, the indentation 990 substantially prevents or minimizes a void from forming at least beneath the indentation 990 (i.e., between the indentation 990 and the ONO layer 920), substantially eliminating or minimizing the likelihood of a short path.

Figure 10:
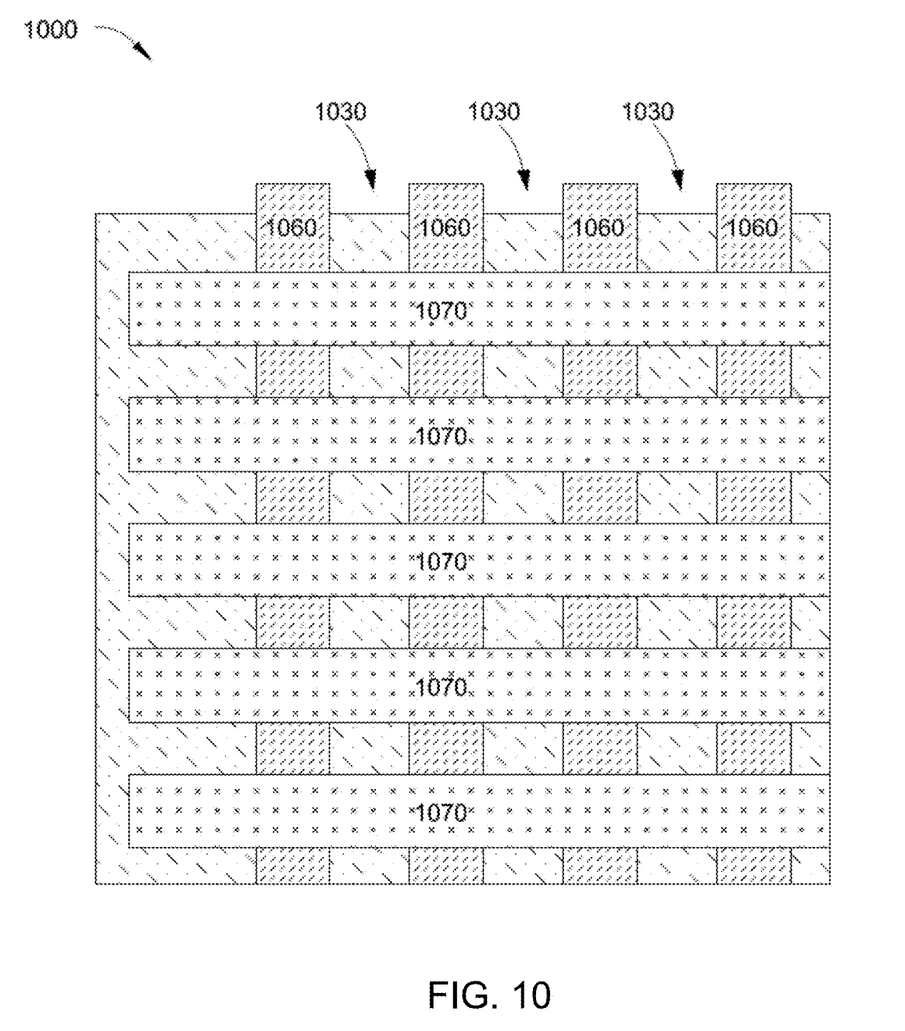
FIG. 10 is a schematic diagram illustrating memory cells, in accordance with the present disclosure

FIG. 10 is a schematic diagram illustrating a top-level perspective view of a group of memory cells 1000. Memory cells 1000 include a polysilicon layer 1030 formed over a substrate (not shown) and a high density plasma (HDP) oxide layer 1060 deposited over apertures defined in the polysilicon layer 1030. Memory cells 1000 also include another polysilicon layer 1070 formed over the polysilicon layer 1030 and HDP oxide layer 1060.

Figure 11:
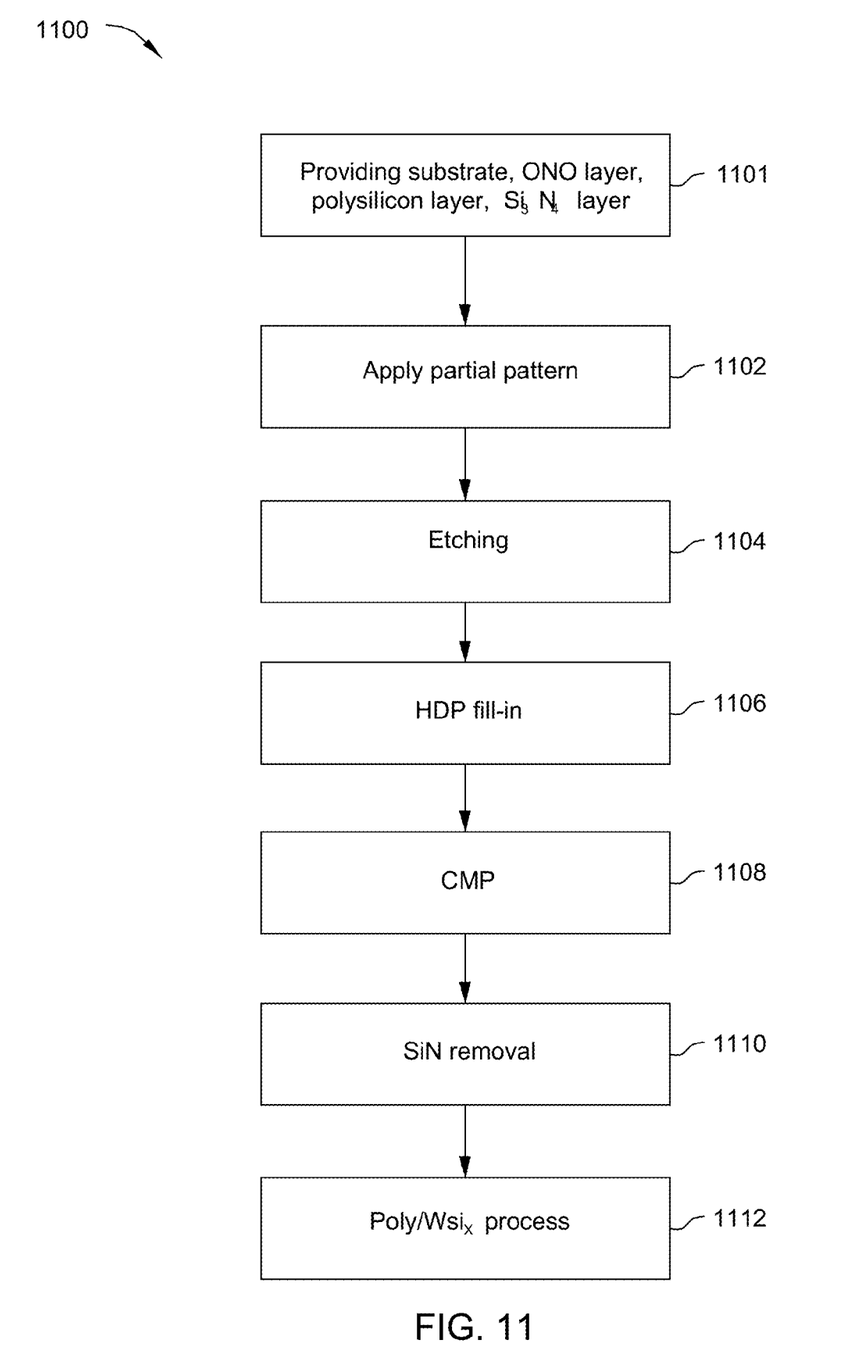
FIG. 11 is a flow diagram illustrating a method for manufacturing a memory cell, in accordance with the present disclosure

FIG. 11 is a flow diagram illustrating a method 1100 for forming a memory cell. A silicon substrate is provided. An oxide-nitride-oxide (ONO) layer is formed over a top surface of the substrate. A polysilicon layer is formed over a top surface of the ONO layer, and a hard mask is formed over a top surface of the polysilicon layer. At action, 1101, the substrate having an oxide-nitride-oxide (ONO) layer formed thereon, a polysilicon layer formed on a top surface of the ONO layer, and a hard mask layer formed on a top surface of the polysilicon layer is provided (as shown in FIG. 3). In an embodiment, the hard mask layer may be a silicon nitride ($Si_3N_4$) layer. In some embodiments, the method includes forming the ONO layer on the substrate, forming the polysilicon layer on the top surface of the ONO layer, and/or forming the hard mask layer on the top surface of the polysilicon layer.

A partial pattern is applied to the polysilicon layer and hard mask layer at action 1102. The application of the partial pattern results in stacks (as shown in FIG. 4). Each stack includes a portion of the polysilicon layer and a portion of the hard mask layer. Apertures are defined between the hard mask and polysilicon layered stacks. Action 1102 may include using an etchant to partially remove the hard mask layer and the polysilicon layer as a hard mask pull back (e.g., silicon nitride pull-back). In some embodiments, phosphoric acid ($H_3PO_4$) is used as the etchant.

At action 1104, the profile of each stack is further defined using a dry etching. The polysilicon layer of each stack has side surfaces adjacent to the apertures, and the hard mask layer of each stack has surfaces adjacent to the apertures. Action 1104 may include etching a top portion of the side surfaces of the polysilicon layer such that the top portion of the side surfaces of the polysilicon layer of each stack are substantially flush with the side surfaces of the hard mask layer of each stack (as shown in FIG. 5). This results in an indentation in the polysilicon layer, which may prevent potential voids from forming down to the substrate. In some embodiments, the top portion of the side surfaces of the polysilicon layer may extend from the top surface of the polysilicon layer to an intermediate cross-section of the polysilicon layer. The intermediate cross-section of the polysilicon layer is a line parallel to the top surface of the polysilicon layer. In an embodiment, a distance defined by a line extending from and perpendicular to the top surface of the polysilicon layer to the cross-section of the polysilicon layer is in the range of 100-200 Å.

At action 1106, an oxide layer filling is formed in the apertures and over the stacks of the polysilicon and hard mask layers (as shown in FIG. 6). When the HDP oxide layer is applied, the indentation substantially prevents or minimizes a void from forming at least beneath the indentation (i.e., between the indentation and the ONO layer), which may substantially eliminate or minimize the likelihood of a short path. The oxide layer filling may include a high density plasma (HDP) oxide. The partial patterning (action 1102) combined with the hard mask pull back also may allow for improved high density plasma (HDP) oxide fill in. The partial patterning and hard mask pull back may result in wider than normal apertures between the stacks. HDP oxide deposition is typically done at an angle, e.g., 45°, and a wider aperture may allow for more even HDP oxide deposition.

At action 1108, a chemical mechanical polishing (CMP) process is used to remove a portion of the oxide layer filling. In an embodiment, the portion removed is such that a top surface of the oxide layer filling is substantially flush with the top surface of the hard mask layer (as shown in FIG. 7).

At action 1110, the hard mask layer is removed. Action 1110 may include using phosphoric acid ($H_3PO_4$) to remove the hard mask layer. Action 1110 may result in a recessed portion defined in the oxide layer filling and the top surface of the polysilicon layer (as shown in FIG. 8).

At action 1112, a second polysilicon layer is formed on a top surface of the oxide layer and on the top surface of the polysilicon layer. The second polysilicon layer may be used to fill in the recessed portion be formed over the stacks (as shown in FIG. 9). This results in the benefit of further minimizing the likelihood of a second polysilicon short path. Also at action 1112, a tungsten polycide ($WSi_x$) layer may be formed on a top surface of the second polysilicon layer (as shown in FIG. 9).

The kinked or indented polysilicon layer design discussed above can be applied to various other structures in memory cell manufacturing processes. For example, the kinked or indented formation can be applied to floating gate technology.

Figure 12:
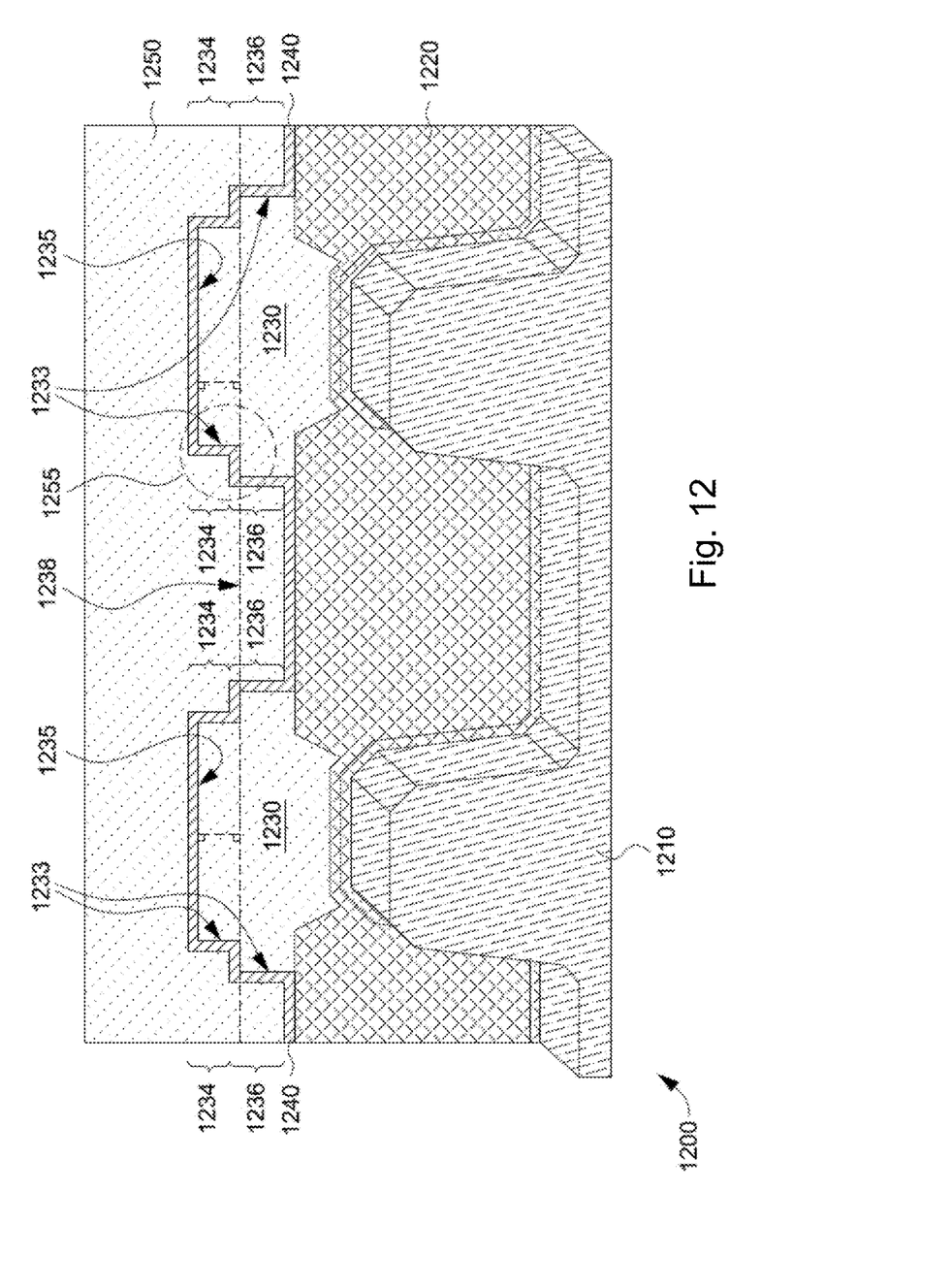
FIG. 12 is a schematic diagram illustrating a floating gate memory cell with an indented profile, in accordance with the present disclosure.

FIG. 12 is a schematic diagram illustrating a floating gate memory cell 1200 having a kinked or indented profile 1255. The floating memory cell may have a substrate 1210, an insulation layer 1220 formed over the substrate 1210, and a polysilicon floating gate structure 1230 formed over the insulation layer 1220. The polysilicon floating gate structure 1230 may have a top portion 1234 and a bottom portion 1236, and, in an embodiment, the top portion 1234 of the polysilicon floating gate structure 1230 is narrower than the bottom portion 1236 of the polysilicon floating gate structure 1230. The polysilicon floating gate structure 1230 may have a top surface 1235 and side surfaces 1233. The top portion 1236 may be defined by the top surface 1235, a top portion of the side surfaces 1233, and an intermediate cross section 1238 of the polysilicon floating gate structure 1230. The intermediate cross section 1238 is defined by a line substantially parallel to the top surface 1235 of the polysilicon floating gate structure 1230. The bottom portion 1236 of the polysilicon floating gate structure 1230 is defined by the intermediate cross section 1238 and a bottom portion of the side surfaces 1233.

In an embodiment, the floating gate memory cell 1200 further includes a second insulation layer 1240 formed over the polysilicon floating gate structure 1230. The floating gate memory cell 1200 may further include a polysilicon or silicide layer 1250 formed over the second insulation layer 1240. The substrate 1210 may be made of a silicon material. The insulation layer 1220 may be made of silicon dioxide. The second insulating layer 1240 may comprise an oxide-nitride-oxide (ONO) layer. Using a kinked or indented profile in the floating gate structure may result in improved polysilicon or silicide material layer fill-in.

Figure 13:
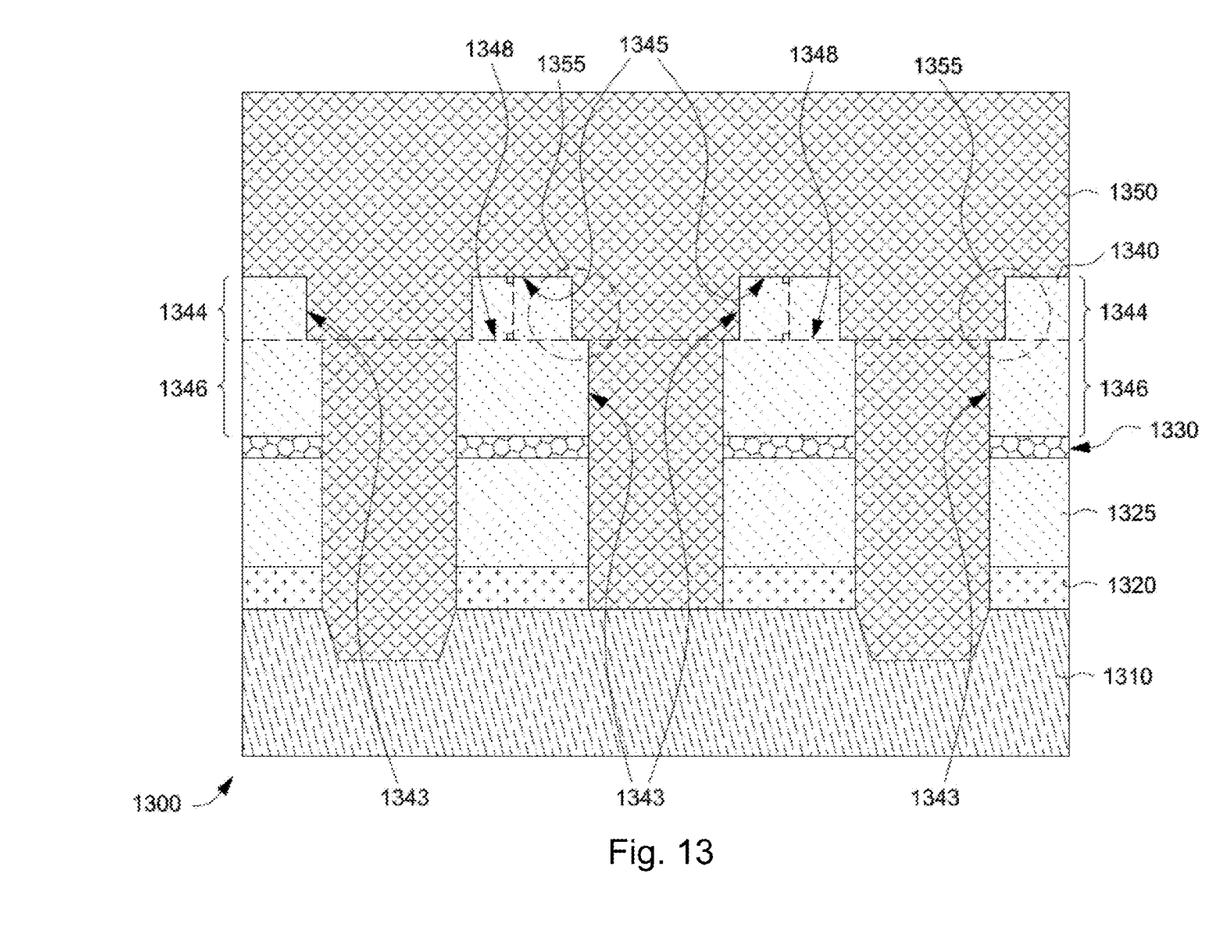
FIG. 13 is a schematic diagram illustrating another floating gate memory cell with an indented profile, in accordance with the present disclosure.

FIG. 13 is a schematic diagram illustrating another floating gate memory cell 1300 having a kinked or indented profile 1355. The floating gate memory cell 1300 may have a substrate 1310, an insulation layer 1320 formed over the substrate 1310, and a polysilicon floating gate structure 1325 formed over the insulation layer 1320. The floating gate memory cell 1300 may further include a second insulation layer 1330 formed over the floating gate structure 1325 and a control gate structure 1340 formed over the second insulation layer 1330. The control gate structure 1340 may have a top portion 1344 and a bottom portion 1346, and, in an embodiment, the top portion 1344 of the control gate structure 1340 is narrower than the bottom portion 1346 of the control gate structure 1340. The control gate structure 1340 may have a top surface 1345 and side surfaces 1343. The top portion 1346 may be defined by the top surface 1345, a top portion of the side surfaces 1343, and an intermediate cross section 1348 of the control gate structure 1340. The intermediate cross section 1348 is defined by a line substantially parallel to the top surface 1345 of the control gate structure 1340. The bottom portion 1346 of the control gate structure 1340 is defined by the intermediate cross section 1348 and a bottom portion of the side surfaces 1343.

In an embodiment, the floating gate memory cell 1300 further includes a third insulation layer 1350 formed over the control gate structure 1340, second insulating layer 1330, polysilicon floating gate structure 1325, insulating layer 1320, and substrate 1310. The substrate 1310 may be made of a silicon material. The insulation layer 1320 may be made of a dielectric material including, but not limited to, various oxide layers. The second insulating layer 1330 may comprise an oxide-nitride-oxide (ONO) layer. The third insulating layer 1350 may be made of silicon dioxide or other suitable insulating materials. The control gate structure 1340 may be made of a silicide material or a polysilicon material. Using a kinked or indented profile 1355 in the control gate structure 1340 may result in improved inter layer dielectric (ILD) piping and/or self-alignment source side fill-in performance.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A memory cell, comprising:
   a substrate;
   one or more stacks formed on the substrate, each stack comprising:
      an oxide-nitride-oxide (ONO) layer formed on a top surface of the substrate; and
      a polysilicon layer formed on a top surface of the ONO layer;
   an oxide layer formed between the stacks; and
   a second polysilicon layer formed over the one or more stacks and the oxide layers formed between the stacks, a portion of the second polysilicon layer formed in contact with a top surface of the polysilicon layer of each of the stacks and another portion of the second polysilicon layer formed in contact with a top surface of each of the oxide layers;
   wherein the polysilicon layer of each of the stacks comprises side surfaces adjacent to the oxide layer between the stacks, and wherein a top portion of the side surfaces of the polysilicon layer is narrower than a bottom portion of the side surfaces of the polysilicon layer.

2. The memory cell of claim 1, wherein the one or more stacks comprise a profile having indented side surfaces.

3. The memory cell of claim 1, wherein the top portion of the side surfaces of the polysilicon layer of each of the stacks extends from the top surface of the polysilicon layer to an intermediate cross-section of the polysilicon layer of each of the stacks, the intermediate cross-section of the polysilicon layer of each of the stacks comprising a line substantially parallel to the top surface of the polysilicon layer, and wherein a distance defined by a line extending from and substantially perpendicular to the top surface of the polysilicon layer to the cross-section of the polysilicon layer of each of the stacks is in the range of 100-200 Å.

4. The memory cell of claim 1, wherein the top portion of the side surfaces of the polysilicon layer of each of the stacks extends from the top surface of the polysilicon layer to an intermediate cross-section of the polysilicon layer of each of the stacks, the intermediate cross-section of the polysilicon layer of each of the stacks comprising a line substantially parallel to the top surface of the polysilicon layer, and wherein a distance defined by a line extending from and substantially perpendicular to the top surface of the polysilicon layer to the cross-section of the polysilicon layer of each of the stacks is in the range of 100-150 Å.

5. The memory cell of claim 1, further comprising a recessed portion defined by the oxide layer filling and the top portion of the side surfaces of the polysilicon layer.

6. The memory cell of claim 5, further comprising:
a second polysilicon layer formed on a top surface of the oxide layer and on the top surface of the polysilicon layer; and
a silicide layer formed on a top surface of the second polysilicon layer.

\* \* \* \* \*